(12) United States Patent
Hirakawa et al.

(10) Patent No.: US 9,184,355 B2
(45) Date of Patent: Nov. 10, 2015

(54) CURABLE RESIN COMPOSITION FOR REFLECTION OF LIGHT, AND OPTICAL SEMICONDUCTOR DEVICE

(75) Inventors: Hiroyuki Hirakawa, Ohtake (JP); Atsushi Sato, Ohtake (JP)

(73) Assignee: DAICEL CORPORATION, Osaka-Shi (JP)

( * ) Notice: Subject to any disclaimer, the term of this patent is extended or adjusted under 35 U.S.C. 154(b) by 53 days.

(21) Appl. No.: 14/006,629

(22) PCT Filed: Jun. 18, 2012

(86) PCT No.: PCT/JP2012/065488
§ 371 (c)(1),
(2), (4) Date: Sep. 20, 2013

(87) PCT Pub. No.: WO2013/002052
PCT Pub. Date: Jan. 3, 2013

(65) Prior Publication Data
US 2014/0008686 A1    Jan. 9, 2014

(30) Foreign Application Priority Data

Jun. 27, 2011 (JP) ................................. 2011-141847

(51) Int. Cl.
| | | |
|---|---|---|
| *C08K 3/22* | (2006.01) | |
| *C08K 7/22* | (2006.01) | |
| *C08K 7/28* | (2006.01) | |
| *C08L 63/00* | (2006.01) | |
| *H01L 33/60* | (2010.01) | |
| *C08K 7/24* | (2006.01) | |
| *C08L 21/00* | (2006.01) | |
| *G02B 5/02* | (2006.01) | |
| *C08K 5/00* | (2006.01) | |
| *C08K 5/1515* | (2006.01) | |
| *C08L 33/10* | (2006.01) | |
| *H01L 33/48* | (2010.01) | |

(52) U.S. Cl.
CPC . *H01L 33/60* (2013.01); *C08K 3/22* (2013.01); *C08K 5/0025* (2013.01); *C08K 5/1515* (2013.01); *C08K 7/24* (2013.01); *C08K 7/28* (2013.01); *C08L 21/00* (2013.01); *C08L 33/10* (2013.01); *C08L 63/00* (2013.01); *G02B 5/0242* (2013.01); *G02B 5/0284* (2013.01); *C08K 2003/222* (2013.01); *C08K 2003/2227* (2013.01); *C08K 2003/2241* (2013.01); *C08K 2003/2244* (2013.01); *H01L 33/48* (2013.01); *H01L 2224/48091* (2013.01); *H01L 2224/48247* (2013.01)

(58) Field of Classification Search
None
See application file for complete search history.

(56) References Cited

U.S. PATENT DOCUMENTS

| | | | |
|---|---|---|---|
| 5,641,997 A * | 6/1997 | Ohta et al. | ............. 257/788 |
| 2002/0111420 A1 | 8/2002 | Papathomas | |
| 2003/0114606 A1 * | 6/2003 | Taniguchi et al. | ............. 525/523 |
| 2007/0251419 A1 * | 11/2007 | Yamaguchi et al. | ..... 106/287.13 |
| 2010/0016494 A1 | 1/2010 | Burns | |
| 2011/0114972 A1 * | 5/2011 | Sato et al. | ............. 257/88 |

FOREIGN PATENT DOCUMENTS

| | | |
|---|---|---|
| JP | 2000-204244 A | 7/2000 |
| JP | 2004-75994 A | 3/2004 |
| JP | 2006-257314 A | 9/2006 |
| JP | 2010-53199 A | 3/2010 |
| JP | 2010-189554 A | 9/2010 |
| WO | WO 2010013407 A1 * | 2/2010 |

OTHER PUBLICATIONS

International Search Report mailed on Jul. 17, 2012, issued in PCT/JP2012/065488.

* cited by examiner

*Primary Examiner* — Robert Sellers
(74) *Attorney, Agent, or Firm* — Birch, Stewart, Kolasch & Birch, LLP

(57) ABSTRACT

Provided are curable resin compositions capable of giving cured articles that have high light reflectivity, are satisfactorily resistant to heat and light, are tough, and less suffer from light reflectivity reduction with time. A curable resin composition for light reflection includes an alicyclic epoxy compound (A), rubber particles (B), a white pigment (C), a curing agent (D), and a curing accelerator (E). Another curable resin composition for light reflection includes an alicyclic epoxy compound (A), rubber particles (B), a white pigment (C), and a curing catalyst (F).

17 Claims, 1 Drawing Sheet

(a) (b)

CURABLE RESIN COMPOSITION FOR REFLECTION OF LIGHT, AND OPTICAL SEMICONDUCTOR DEVICE

TECHNICAL FIELD

The present invention relates to curable resin compositions for light reflection; and optical semiconductor devices. More specifically, the present invention relates to a curable resin composition for light reflection, which gives a cured article having high light reflectivity, being satisfactorily resistant to heat and light, and being tough; and to an optical semiconductor device including an optical semiconductor element; and a reflector including the cured article.

BACKGROUND ART

Light-emitting devices using optical semiconductor elements as light sources have been increasingly used typically in indoor or outdoor display boards, image-reading light sources, traffic signals, and large-screen display units. As the light-emitting devices, there are generally widely employed light-emitting devices having an optical semiconductor element and a transparent resin to protect the optical semiconductor element and the periphery thereof, and further has a reflector (reflective member) for light reflection. The reflector is provided for higher extraction efficiency of light emitted from the optical semiconductor element.

The reflector should have high light reflectivity and should be able to continuously exhibit such high light reflectivity. Customary known components for the reflector include resin compositions each including a polyamide resin (polyphthalamide resin) having a terephthalic acid unit as an essential constitutional unit; and an inorganic filler or another component dispersed in the polyamide resin (see Patent Literature (PTL) 1 to 3).

CITATION LIST

Patent Literature

PTL 1: Japanese Unexamined Patent Application Publication (JP-A) No. 2000-204244
PTL 2: JP-A No. 2004-75994
PTL 3: JP-A No. 2006-257314

SUMMARY OF INVENTION

Technical Problem

The reflectors including the polyamide resins, however, disadvantageously suffer from deterioration such as yellowing with time due to light and/or heat emitted from the optical semiconductor element and fail to maintain sufficient light reflectivity particularly in light-emitting devices using high-power blue or white optical semiconductors as light sources. To produce light-emitting devices, a reflow process (solder reflow process) may be performed. With the adaptation of lead-free solder, the reflow process tends to be performed at a higher heating temperature. Heat applied on the reflectors during such a production process also disadvantageously causes deterioration of the reflectors with time to thereby cause reduction in light reflectivity.

The reflector should also be tough typically so as to be resistant to cracks (cracking) when stress is applied due to cutting or temperature change (e.g., in heating at a very high temperature as in the reflow process, or in a thermo-cycle (temperature cycle)). This property is hereinafter also referred to as "cracking resistance". The cracking resistance is needed, because the reflector, if undergoing cracking, has lower light reflectivity (namely, causes a lower light extraction efficiency) and hardly ensures the reliability of light-emitting device.

Under these circumstances, demands are now made to provide a material that is satisfactorily resistant to heat and light and is tough so as to form a reflector less suffers from light reflectivity reduction with time and to cracking even when exposed to light having a higher power or a shorter wavelength or exposed to an elevated temperature.

Accordingly, an object of the present invention is to provide a curable resin composition that gives a cured article as follows. The cured article has high light reflectivity, is satisfactorily resistant to heat and light, is tough, and less suffers from light reflectivity reduction with time.

Another object of the present invention is to provide an optical semiconductor device that less suffers from light intensity reduction with time and has high reliability.

Solution to Problem

After intensive investigations to achieve the objects, the present inventors have found a curable resin composition including an alicyclic epoxy compound, rubber particles, a white pigment, a curing agent, and a curing accelerator as essential components; and a curable resin composition including an alicyclic epoxy compound, rubber particles, a white pigment, and a curing catalyst as essential components. The present inventors also found that these curable resin compositions give cured articles which have high light reflectivity, are satisfactorily resistant to heat and light, are tough, and less suffer from light reflectivity reduction with time. The present invention has been made based on these findings.

Specifically, the present invention provides, in an embodiment, a curable resin composition for light reflection, including: an alicyclic epoxy compound (A); rubber particles (B); a white pigment (C); a curing agent (D); and a curing accelerator (E).

The present invention further provides, in another embodiment, a curable resin composition for light reflection, including: an alicyclic epoxy compound (A); rubber particles (B); a white pigment (C); and a curing catalyst (F).

In a preferred embodiment of the curable resin compositions for light reflection, the rubber particles (B) includes a polymer including a (meth)acrylic ester as an essential monomer component; the rubber particles (B) have hydroxyl group and/or carboxyl group on a surface thereof; and the rubber particles (B) have an average particle diameter of from 10 to 500 nm and a maximum particle diameter of from 50 to 1000 nm.

In another preferred embodiment of the curable resin compositions for light reflection, the white pigment (C) is at least one selected from the group consisting of aluminum oxides, magnesium oxide, antimony oxides, titanium dioxide, zirconium oxide, and inorganic hollow particles.

In the curable resin compositions for light reflection, the white pigment (C) may have a median particle diameter of from 0.1 to 50 μm.

The curable resin compositions for light reflection may serve as curable resin compositions for LED packaging.

In addition and advantageously, the present invention provides an optical semiconductor device at least including: an optical semiconductor element; and a reflector, the reflector including a cured article derived from any of the curable resin compositions for light reflection.

Advantageous Effects of Invention

The curable resin compositions for light reflection according to embodiments the present invention have the configurations and give, through curing, cured articles that have high light reflectivity, are satisfactorily resistant to heat and light, are so tough as to be resistant to cracking, and less suffer from light reflectivity reduction with time. The curable resin compositions for light reflection according to the present invention are therefore advantageously usable in various uses related to optical semiconductor devices. In particular, when the curable resin compositions for light reflection according to the present invention give cured articles to form reflectors (reflective members), the reflectors can continuously exhibit high light reflectivity over a long duration. Optical semiconductor devices (light-emitting devices) including an optical semiconductor element and any of the reflectors can serve as long-life optical semiconductor devices with high reliability.

BRIEF DESCRIPTION OF DRAWINGS

FIG. 1 are schematic diagrams illustrating an optical semiconductor device as an embodiment, which has a reflector including a cured article derived from a curable resin composition for light reflection according to the present invention, in which FIG. 1(a) is a perspective view; and FIG. 1(b) is a cross-sectional view.

DESCRIPTION OF EMBODIMENTS

Figure 1:
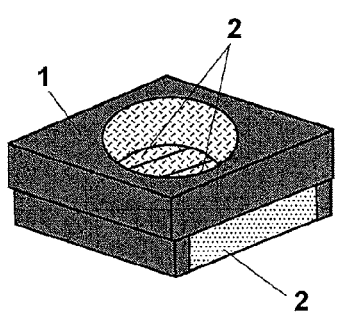
Figure 1:
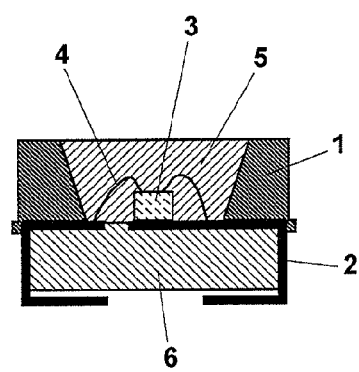

Curable Resin Compositions for Light Reflection Curable resin compositions for light reflection according to embodiments of the present invention are any of a curable resin composition including an alicyclic epoxy compound (A), rubber particles (B), a white pigment (C), a curing agent (D), and a curing accelerator (E) as essential components; and a curable resin composition including an alicyclic epoxy compound (A), rubber particles (B), a white pigment (C), and a curing catalyst (F) as essential components.

As used herein the term "curable resin composition for light reflection" refers to a curable resin composition capable of forming, through curing, a cured article that has high light reflectivity. Specifically, the term refers typically to a curable resin composition capable of forming a cured article that has a reflectance of 80% or more with respect to light at a wavelength of 450 nm.

Alicyclic Epoxy Compound (A)

The alicyclic epoxy compound (alicyclic epoxy resin) (A) as an essential component in each of the curable resin compositions for light reflection according to the present invention is an alicyclic compound having an epoxy group formed by oxygen atom and adjacent two carbon atoms constituting an alicycle and can be any one as selected from among known or customary ones. The alicyclic epoxy compound is preferably one that is liquid at room temperature (25° C.) for good workability upon preparation and casting.

The alicyclic epoxy compound (A) is particularly preferably an alicyclic epoxy compound represented by Formula (1) for satisfactory resistance to heat and light (particularly to ultraviolet rays). Formula (1) is expressed as follows:

[Chem. 1]

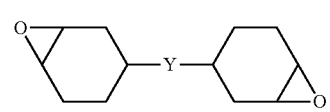

(1)

In Formula (1), Y represents a single bond or a linkage group. The linkage group refers to a divalent group having one or more atoms and is exemplified by divalent hydrocarbon groups, carbonyl group (—CO—), ether bond (—O—), ester bond (—COO—), amide bond (—CONH—), carbonate bond (—OCOO—), and groups each including two or more of them as linked.

The divalent hydrocarbon groups are exemplified by straight or branched chain alkylene groups having 1 to 18 carbon atoms; and divalent alicyclic hydrocarbon groups. More specifically, the straight or branched chain alkylene groups having 1 to 18 carbon atoms are exemplified by methylene, methylmethylene, dimethylmethylene, ethylene, propylene, and trimethylene groups. The divalent alicyclic hydrocarbon groups are exemplified by divalent cycloalkylene groups (including cycloalkylidene groups), such as 1,2-cyclopentylene, 1,3-cyclopentylene, cyclopentylidene, 1,2-cyclohexylene, 1,3-cyclohexylene, 1,4-cyclohexylene, and cyclohexylidene groups.

The alicyclic epoxy compound represented by Formula (1) is typified by compounds represented by Formulae (1a) to (1j) below. In the following formulae, each of n1 to n8 independently represents an integer of from 1 to 30. In Formula (1e), —O—R—O— represents a diol residue; and R is exemplified by a divalent hydrocarbon group, and a divalent group including two or more divalent hydrocarbon groups bonded to each other through one or more linkage groups (e.g., ether bond, ester bond, amide bond, and carbonyl group). The divalent hydrocarbon group is exemplified by groups as with the divalent hydrocarbon group as Y. Formulae (1a) to (1j) are expressed as follows:

[Chem. 2]

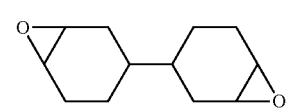

(1a)

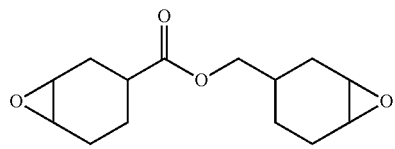

(1b)

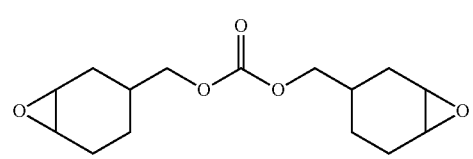

(1c)

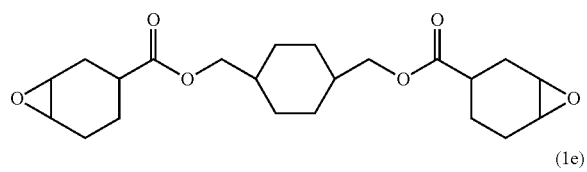
(1d)

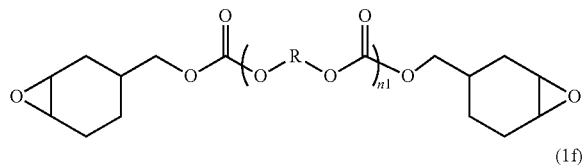
(1e)

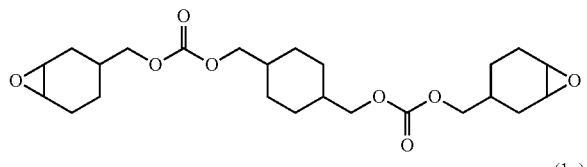
(1f)

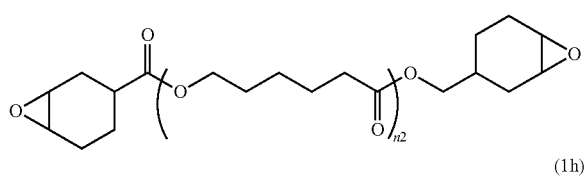
(1g)

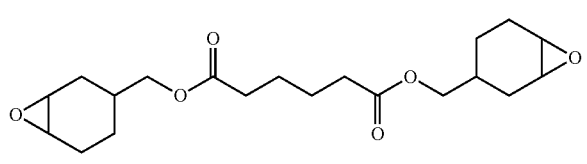
(1h)

[Chem. 3]

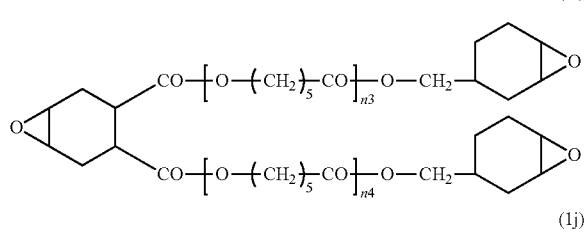
(1i)

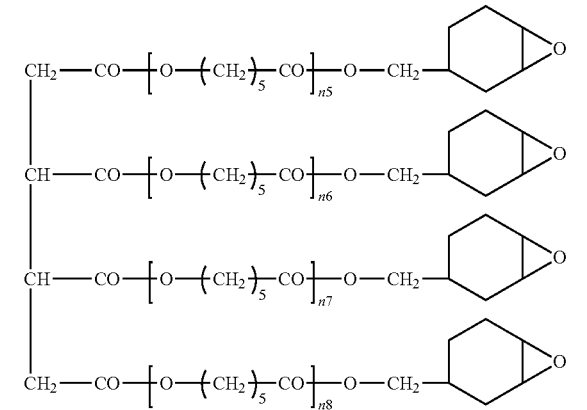
(1j)

Each of different alicyclic epoxy compounds may be used alone or in combination as the alicyclic epoxy compound (A). Such alicyclic epoxy compounds are also available as commercial products typically under the trade names of "CELLOXIDE 2021P" and "CELLOXIDE 2081" each from Daicel Chemical Industries Ltd.

The curable resin composition for light reflection according to the present invention may contain the alicyclic epoxy compound (A) in an amount (blending amount) not critical, but preferably from 60 to 100 percent by weight and more preferably from 80 to 100 percent by weight, based on the total amount (100 percent by weight) of epoxy-containing compounds (entire epoxy-containing compounds) contained in the curable resin composition for light reflection. The curable resin composition, if including the alicyclic epoxy compound (A) in an amount of less than 60 percent by weight, may readily give a cured article having insufficient resistance to heat and light.

Rubber Particles (B)

The rubber particles (B) serve as an essential component in the curable resin composition for light reflection according to the present invention and are particles having rubber elasticity (elastomeric particles). The rubber particles (B) are not limited, but are preferably rubber particles including a polymer (acrylic polymer) derived from a (meth)acrylic ester as an essential monomer component, for satisfactory resistance to heat and light. The rubber particles (B) are also preferably rubber particles (core-shell rubber particles) having a multi-layer structure (core-shell structure) including an elastomeric core; and at least one shell layer covering the core. This is because such core-shell rubber particles have good dispersibility and readily effectively contribute to better toughness (better cracking resistance). Each of different types of rubber particles may be used alone or in combination as the rubber particles (B).

Specifically, the rubber particles (B) are preferably core-shell rubber particles including a polymer (acrylic polymer) including a (meth)acrylic ester as an essential monomer component.

In the core-shell rubber particles when employed as the rubber particles (B), the polymer constituting the elastomeric core essentially includes, as a monomer component, a (meth)acrylic ester such as methyl(meth)acrylate, ethyl(meth)acrylate, and/or butyl(meth)acrylate. The polymer may further include one or more other monomer components in addition to (meth)acrylic esters. The other monomer components are exemplified by aromatic vinyl monomers such as styrene and α-methylstyrene; nitriles such as acrylonitrile and methacrylonitrile; conjugated dienes such as butadiene and isoprene; and ethylene, propylene, and isobutene. Each of different monomer components may be used alone or in combination.

The polymer constituting the elastomeric core in the rubber particles (B) (core-shell rubber particles) for use herein preferably includes, as monomer components, a (meth)acrylic ester in combination with at least one selected from the group consisting of aromatic vinyl monomers, nitriles, and conjugated dienes. The polymer constituting the core is exemplified by binary copolymers such as (meth)acrylic ester/aromatic vinyl copolymers and (meth)acrylic ester/conjugated diene copolymers; and ternary copolymers such as (meth)acrylic ester/aromatic vinyl/conjugated diene copolymers. The polymer constituting the core may further include any of silicones such as polydimethylsiloxanes and polyphenylmethylsiloxane; and polyurethanes.

Monomer components constituting the elastomeric core in the rubber particles (B) (core-shell rubber particles) may further contain, in addition to the above monomer components, one or more reactive crosslinkable monomers having two or more reactive functional groups per monomer (per molecule). Such reactive crosslinkable monomers may correspond typically to divinylbenzene, allyl(meth)acrylate, ethylene glycol di(meth)acrylate, diallyl maleate, triallyl cyanurate, diallyl phthalate, and butylene glycol diacrylate.

Above all, the elastomeric core in the rubber particles (B) (core-shell rubber particles) is preferably a core including any of (meth)acrylic ester/aromatic vinyl binary copolymers (of which butyl acrylate/styrene binary copolymers are more preferred).

The polymer constituting the elastomeric core in the rubber particles (B) (core-shell rubber particles) may have a glass transition temperature not critical, but preferably from −100° C. to 10° C., more preferably from −80° C. to −10° C., and furthermore preferably from −60° C. to −20° C., for better toughness (better cracking resistance). The polymer, when having a glass transition temperature within the above-specified range, can help the cured article to exhibit better toughness. The glass transition temperature may be measured typically with any of various thermal analyzers such as differential scanning calorimeters (DSCs) and thermomechanical analyzers (IMAs).

The elastomeric core of the rubber particles (B) (core-shell rubber particles) can be prepared by a commonly employed process such as emulsion polymerization of the monomers. The emulsion polymerization may be performed by subjecting all of the monomers to polymerization at a time; or by subjecting part of the monomers to polymerization, and thereafter subjecting the remainder to polymerization continuously or intermittently. The emulsion polymerization may also employ a polymerization procedure using seed particles.

Rubber particles having no core-shell structure, when used as the rubber particles (B), can for example be rubber particles including the elastomeric core alone.

The shell layer in the rubber particles (B) (core-shell rubber particles) preferably includes a polymer different from the polymer constituting the core. The shell layer preferably has hydroxyl group and/or carboxyl group (one or both of hydroxyl group and carboxyl group) as a functional group that is reactive with the alicyclic epoxy compound (A). Specifically, the rubber particles (B) preferably have, on their surface, hydroxyl group and/or carboxyl group as a functional group reactive with the alicyclic epoxy compound (A). The hydroxyl group and/or carboxyl group, when present on the surface of the rubber particles (B), can contribute to better adhesiveness at the interface with the alicyclic epoxy compound (A). This allows a curable resin composition including the rubber particles (B) having the shell layer to give, through curing, a cured article that is tough (particularly is satisfactorily resistant to cracking). This also prevents the cured article from having a lower glass transition temperature.

Monomer components to form the shell layer of the rubber particles (B) (core-shell rubber particles) preferably include a (meth)acrylic ester as an essential component. The (meth)acrylic ester is exemplified by methyl(meth)acrylate, ethyl (meth)acrylate, and butyl(meth)acrylate. Typically when butyl acrylate is used as the (meth)acrylic ester to form the core of the rubber particles (B) (core-shell rubber particles), the shell layer preferably employs another (meth)acrylic ester than butyl acrylate, such as methyl(meth)acrylate, ethyl (meth)acrylate, or butyl methacrylate. The shell layer may further include one or more other monomer components than (meth)acrylic esters. The other monomer components are exemplified by aromatic vinyl monomers such as styrene and α-methylstyrene; and nitriles such as acrylonitrile and methacrylonitrile. Monomer components to form the shell layer of the rubber particles (B) (core-shell rubber particles) for use herein preferably include, in addition to at least one (meth) acrylic ester, any of the monomers alone or in combination.

The monomer components preferably further contain one or more monomers corresponding typically to hydroxyalkyl (meth)acrylates such as 2-hydroxyethyl(meth)acrylate; α,β-unsaturated acids such as (meth)acrylic acid; and α,β-unsaturated acid anhydrides such as maleic anhydride. These monomers serve as monomer components having hydroxyl group and/or carboxyl group as a functional group reactive with the alicyclic epoxy compound (A).

The monomer components to form the shell layer of the rubber particles (B) (core-shell rubber particles) preferably contain at least one (meth)acrylic ester in combination with at least one monomer selected from the aforementioned monomers. Specifically, the shell layer in the rubber particles (B) (core-shell rubber particles) is preferably a shell layer including, for example, a ternary copolymer such as a (meth)acrylic ester/aromatic vinyl/hydroxyalkyl(meth)acrylate copolymer or a (meth)acrylic ester/aromatic vinyl/β,β-unsaturated acid copolymer.

The monomer components to form the shell layer of the rubber particles (B) (core-shell rubber particles) may further contain, in addition to the above monomer components, one or more reactive crosslinkable monomers having two or more reactive functional groups per monomer (per molecule), as with the core. Such reactive crosslinkable monomers may correspond typically to divinylbenzene, allyl(meth)acrylate, ethylene glycol di(meth)acrylate, diallyl maleate, triallyl cyanurate, diallyl phthalate, and butylene glycol diacrylate.

A polymer to form the shell layer in the rubber particles (B) (core-shell rubber particles) may have a glass transition temperature not critical, but preferably from 20° C. to 200° C., more preferably from 40° C. to 180° C., and furthermore preferably from 60° C. to 160° C., for better dispersibility and better toughness (better cracking resistance). The polymer, when having a glass transition temperature within the above-specified range, can contribute to better toughness.

A way to cover the core with the shell layer is exemplified by a process of applying a copolymer constituting a shell layer onto an elastomeric core to cover the core, which core has been prepared by the above-mentioned process; and a process of performing graft polymerization using an elastomeric core as a backbone component in combination with respective components constituting the shell layer as side-chain components, which core has been prepared by the aforementioned process.

Though not critical, the rubber particles (B) have an average particle diameter of preferably from 10 to 500 nm and more preferably from 20 to 400 nm. The rubber particles (B), if having an average particle diameter of more than 500 nm, may not effectively contribute to better toughness and may aggregate to impede kneading and to cause inferior dispersibility. This may readily cause inferior moldability of the curable resin composition for light reflection. In contrast, the rubber particles (B), if having an average particle diameter of less than 10 nm, may often fail to exhibit sufficient effects and may cause the cured article to have insufficient toughness.

Though not critical, the rubber particles (B) may have a maximum particle diameter of preferably from 50 to 1000 nm and more preferably from 100 to 800 nm. The rubber particles (B), if having a maximum particle diameter of more than 1000 nm, may not effectively contribute to better toughness and may aggregate to impede kneading and to cause inferior dispersibility. This may readily cause inferior moldability of the curable resin composition for light reflection. In contrast, the rubber particles (B), if having a maximum particle diameter of smaller than 50 nm, may often fail to exhibit sufficient effects and may cause the cured article to have insufficient toughness.

The curable resin composition for light reflection according to the present invention may include the rubber particles (B) in an amount (blending amount) not critical, but preferably from 1 to 50 parts by weight and more preferably from 3 to 40 parts by weight, per 100 parts by weight of the total amount of epoxy-containing compounds (entire epoxy-containing compounds) contained in the curable resin composition for light reflection. The curable resin composition, if containing the rubber particles (B) in an amount of smaller than 1 part by weight, may often give a cured article having effectively better toughness. In contrast, the curable resin composition, if containing the rubber particles (B) in an amount of more than 50 parts by weight, may become difficult to be kneaded and may exhibit inferior deaeration (debubbling) property and/or inferior dispersibility.

The rubber particles (B) may be dispersed in another component prior to the blending of respective components to form the curable resin composition for light reflection according to the present invention. Particularly for better dispersibility and workability, the rubber particles (B) are preferably dispersed in the alicyclic epoxy compound (A) prior to the blending. Such a composition including the alicyclic epoxy compound (A) and the rubber particles (B) dispersed therein is also referred to as a "rubber-particle-dispersed epoxy compound".

The rubber-particle-dispersed epoxy compound is prepared by dispersing the rubber particles (B) in the alicyclic epoxy compound (A). The amount of the rubber particles (B) in the rubber-particle-dispersed epoxy compound may correspond to the total amount or part of the rubber particles (B) constituting the curable resin composition for light reflection.

The amount of the alicyclic epoxy compound (A) constituting the rubber-particle-dispersed epoxy compound may correspond to the total amount or part of the alicyclic epoxy compound (A) constituting the curable resin composition for light reflection according to the present invention. Though not critical, the amount of the alicyclic epoxy compound (A) constituting the rubber-particle-dispersed epoxy compound is preferably from 30 to 100 percent by weight and more preferably from 50 to 100 percent by weight of the total amount (100 percent by weight) of the alicyclic epoxy compound (A) contained in the curable resin composition for light reflection.

The rubber-particle-dispersed epoxy compound may contain the rubber particles (B) in a content of preferably from 0.5 to 30 percent by weight and more preferably from 1 to 20 percent by weight, based on the total amount (100 percent by weight) of the rubber-particle-dispersed epoxy compound, though the content can be suitably regulated according to necessity and is not critical.

Though not critical, the rubber-particle-dispersed epoxy compound may have a viscosity of preferably from 400 mPa·s to 50000 mPa·s and more preferably from 500 mPa·s to 10000 mPa·s in terms of viscosity at 25° C. (viscosity (25° C.)). The rubber-particle-dispersed epoxy compound, if having a viscosity (25° C.) of less than 400 mPa·s, may cause the resin composition to have insufficient moldability. In contrast, the rubber-particle-dispersed epoxy compound, if having a viscosity (25° C.) of more than 50000 mPa·s, may cause poor productivity both in the production of the rubber-particle-dispersed epoxy compound and in the production of the curable resin composition for light reflection.

The viscosity of the rubber-particle-dispersed epoxy compound can be regulated by the combination use of a reactive diluent. The reactive diluent usable herein is preferably an aliphatic polyglycidyl ether having a viscosity at room temperature (25° C.) of 200 mPa·s or less. The aliphatic polyglycidyl ether having a viscosity (25° C.) of 200 mPa·s or less is exemplified by cyclohexanedimethanol diglycidyl ether, cyclohexanediol diglycidyl ether, neopentyl glycol diglycidyl ether, 1,6-hexanediol diglycidyl ether, trimethylolpropane triglycidyl ether, and polypropylene glycol diglycidyl ether. Each of different reactive diluents may be used alone or in combination.

The amount of the reactive diluent can be suitably regulated, is not critical, but is preferably 30 parts by weight or less and more preferably 25 parts by weight or less (e.g., from 5 to 25 parts by weight) per 100 parts by weight of the total amount of the rubber-particle-dispersed epoxy compound. The reactive diluent, if used in an amount of more than 30 parts by weight, may often impede the cured article to have desired properties such as toughness (better cracking resistance).

The rubber-particle-dispersed epoxy compound can be prepared by any process such as known or customary processes. Typically, the rubber-particle-dispersed epoxy compound may be prepared by a process of dewatering and drying the rubber particles (B) to give a powder, and mixing and dispersing the powder in the alicyclic epoxy compound (A); or a process of directly mixing an emulsion of the rubber particles (B) with the alicyclic epoxy compound (A) and dewatering the resulting mixture.

White Pigment (C)

The white pigment (C) serving as an essential component of the curable resin composition for light reflection according to the present invention helps the curable resin composition to give a cured article that exhibits high light reflectivity. The white pigment (C) can be any of known or customary white pigments, but is exemplified by inorganic white pigments including glass, clay, mica, talc, kaolinite (kaolin), halloysite, zeolite, acid clay, activated clay, boehmite, pseudoboehmite, inorganic oxides, and metal salts such as alkaline earth metal salts; organic white pigments (e.g., plastic pigments) including pigments of resins such as styrenic resins, benzoguanamine resins, urea-formalin resins, melamine-formalin resins, and amide resins; and hollow particles having a hollow structure (balloon structure). Each of different white pigments may be used alone or in combination as the white pigment (C).

The inorganic oxides are exemplified by aluminum oxide (alumina), magnesium oxide, antimony oxides, titanium dioxides (rutile-type titanium dioxide, anatase-type titanium dioxide, and brookite-type titanium dioxide), zirconium oxide, zinc oxide, and silicon oxides. The alkaline earth metal salts are exemplified by magnesium carbonate, calcium carbonate, barium carbonate, magnesium silicate, calcium silicate, magnesium hydroxide, magnesium phosphate, magnesium hydrogenphosphate, magnesium sulfate, calcium sulfate, and barium sulfate. The other metal salts than the alkaline earth metal salts are exemplified by aluminum silicate, aluminum hydroxide, and zinc sulfide.

The hollow particles are exemplified by, but not limited to, inorganic hollow particles (including naturally-occurring substances such as shirasu balloons) made from inorganic substances such as inorganic glass (e.g., sodium silicate glass, aluminosilicate glass, sodium borosilicate glass, and quartz), silica, alumina, and other metal oxides, calcium carbonate, barium carbonate, nickel carbonate, calcium silicate, and other metal salts; organic hollow particles made from organic substances including polymers (including crosslinked products of the polymers), such as styrenic resins, acrylic resin, silicone resins, acrylic-styrene resins, vinyl chloride resins, vinylidene chloride resins, amide resins, urethane resins, phenolic resins, styrene-conjugated diene resins, acrylic-conjugated diene resins, and olefinic resin; and inorganic-organic hollow particles made from hybrid materials between an inorganic substance and an organic substance. The hollow particles may be made from a single material or two or more different materials. The hollow part of the hollow particles (space inside the hollow particles) may be in a vacuum or filled with a medium. Among such hollow particles, those filled with a medium having a low refractive index are preferred for higher reflectance. The medium is exemplified by nitrogen, argon, and other inert gases; and air.

The white pigment (C) may have been subjected to a known or customary surface treatment such as a surface treatment with a surface preparation agent. The surface preparation agent is exemplified by metal oxides, silane coupling agents, titanium coupling agents, organic acids, polyols, and silicones. The surface treatment may help the white pigment (C) to have better compatibility and/or dispersibility with other components in the curable resin composition for light reflection.

Among such white pigments, the white pigment (C) is preferably any of inorganic oxides and inorganic hollow particles, and is more preferably at least one white pigment selected from the group consisting of aluminum oxide, magnesium oxide, antimony oxides, titanium dioxides, zirconium oxide, and inorganic hollow particles from the viewpoints of availability and resistance to heat and light. The white pigment (C) is particularly preferably a titanium dioxide as having a higher refractive index.

The white pigment (C) may have any shape not critical, such as spheroid, crushed, fibrous, needle-like, flaky, and whisker shapes. Particularly for satisfactory dispersibility, the white pigment (C) is preferably a spheroid white pigment, and is more preferably a spherical white pigment (e.g., a spheroid white pigment having an aspect ratio of 1.2 or less).

Though not critical, the white pigment (C) preferably has a median particle diameter of from 0.1 to 50 μm for better light reflectivity. Typically, an inorganic oxide, when used as the white pigment (C), may have a median particle diameter not critical, but preferably from 0.1 to 50 μm, more preferably from 0.1 to 30 μm, furthermore preferably from 0.1 to 20 μm, particularly preferably from 0.1 to 10 μm, and most preferably from 0.1 to 5 μm. Hollow particles (particularly, inorganic hollow particles), when used as the white pigment (C), may have a median particle diameter not critical, but preferably from 0.1 to 50 μm and more preferably from 0.1 to 30 μm. The term "median particle diameter" refers to a value (median diameter) of the particle diameter at 50% in a cumulative distribution as measured by a laser diffraction/scattering technique.

The curable resin composition for light reflection according to the present invention may include the white pigment (C) in an amount (blending amount) not critical, but preferably from 80 to 500 parts by weight, more preferably from 90 to 400 parts by weight, and furthermore preferably from 100 to 380 parts by weight, per 100 parts by weight of the total amount of epoxy-containing compounds (entire epoxy-containing compounds) contained in the curable resin composition for light reflection. The curable resin composition, if containing the white pigment (C) in an amount of less than 80 parts by weight, may often give a cured article having insufficient light reflectivity. In contrast, the curable resin composition, if containing the white pigment (C) in an amount of more than 500 parts by weight, may readily give a cured article having insufficient toughness.

The white pigment (C) can be prepared by a known or customary preparation process. The white pigment (C) may also be any of commercial products. The commercial products are exemplified by rutile-type titanium dioxide products available typically under the trade names of "SR-1", "R-42", "R-45M", "R-650", "R-32", "R-5N", "GTR-100", "R-62N", "R-7E", "R-44", "R-3L", "R-11P", "R-21", "R-25", "TCR-52", "R-310", "D-918", and "FTR-700" (each from Sakai Chemical Industry Co., Ltd.), the trade names of "TIPAQUE CR-50", "CR-50-2", "CR-60", "CR-60-2", "CR-63", "CR-80", "CR-90", "CR-90-2", "CR-93", "CR-95", and "CR-97" (each from ISHIHARA SANGYO KAISHA, LTD.), the trade names of "JR-301", "JR-403", "JR-405", "JR-600A", "JR-605", "JR-600E", "JR-603", "JR-805", "JR-806", "JR-701", "JRNC", "JR-800", and "JR" (each from TAYCA CORPORATION), the trade names of "TR-600", "TR-700", "TR-750", "TR-840", and "TR-900" (each from Fuji Titanium Industry Co., Ltd.), the trade name of "KR-310", "KR-380", and "KR-380N" (each from Titan Kogyo, Ltd.), and the trade names of "ST-410WB", "ST-455", "ST-455WB", "ST-457SA", "ST-457EC", "ST-485SA15", "ST-486SA", and "ST-495M" (each from Titan Kogyo, Ltd.); and anatase-type titanium dioxide products available typically under the trade names of "A-110", "TCA-123E", "A-190", "A-197", "SA-1", "SA-1L", "SSP Series", and "CSB Series" (each from Sakai Chemical Industry Co., Ltd.), the trade names of "JA-1", "JA-C", and "JA-3" (each from TAYCA CORPORATION), and the trade names of "KA-10", "KA-15", "KA-20", "STT-65C-S", and "STT-30EHJ" (each from Titan Kogyo, Ltd.).

Curing Agent (D)

The curing agent (D) in the curable resin composition for light reflection according to the present invention has the function of curing an epoxy-containing compound. The curing agent (D) is not limited and can be any of curing agents customarily known as epoxy-resin curing agents. Among them, the curing agent (D) is preferably any of acid anhydrides that are liquid at 25° C., such as methyltetrahydrophthalic anhydride, methylhexahydrophthalic anhydride, dodecenylsuccinic anhydride, and methyl-endomethylene-tetrahydrophthalic anhydride. Even an acid anhydride that is solid at room temperature (25° C.) can also be used as the curing agent (D) by dissolving the solid acid anhydride in an acid anhydride that is liquid at room temperature (25° C.) and thereby forming a liquid mixture. The acid anhydride that is solid at room temperature is exemplified by phthalic anhydride, tetrahydrophthalic anhydride, hexahydrophthalic anhydride, and methylcyclohexenedicarboxylic anhydride. Each of different curing agents may be used alone or in combination as the curing agent (D).

The curing agent (D) for use herein can also be any of commercial products such as those available typically under the trade name of "RIKACID MH-700" (from New Japan Chemical Co., Ltd.); and the trade name of "HN-5500" (from Hitachi Chemical Company, Ltd.).

The curable resin composition for light reflection according to the present invention may contain the curing agent (D) in an amount (blending amount) not critical, but preferably from 50 to 150 parts by weight, more preferably from 52 to 145 parts by weight, and furthermore preferably from 55 to 140 parts by weight, per 100 parts by weight of the total amount of epoxy-containing compounds (entire epoxy-containing compounds) contained in the curable resin composition for light reflection. More specifically, the curable resin composition preferably contains the curing agent (D) in an amount of from 0.5 to 1.5 equivalents per 1 equivalent of epoxy groups in entire epoxy-containing compounds contained in the curable resin composition for light reflection. The curable resin composition, if containing the curing agent (D) in an amount of less than 50 parts by weight, may often give a cured article having insufficient toughness and exhibiting insufficient cracking resistance. In contrast, the curable resin composition, if containing the curing agent (D) in an amount of more than 150 parts by weight, may give a cured article that is colored and has an inferior hue.

Curing Accelerator (E)

The curing accelerator (E) in the curable resin composition for light reflection according to the present invention serves as a compound having the function of accelerating the curing rate (curing speed) of an epoxy-containing compound upon curing by the action of the curing agent (D). The curing accelerator (E) usable herein can be any of known or customary curing accelerators without limitation, but is exemplified by 1,8-diazabicyclo[5.4.0]undecene-7 (DBU) and salts thereof (e.g., phenol salt, octylic acid salt, p-toluenesulfonic acid salt, formic acid salt, and tetraphenylborate salt); 1,5-diazabicyclo[4.3.0]nonene-5 (DBN) and salts thereof (e.g., phosphonium salt, sulfonium salt, quaternary ammonium salt, and iodonium salt); tertiary amines such as benzyldimethylamine, 2,4,6-tris(dimethylaminomethyl)phenol, and N,N-dimethylcyclohexylamine; imidazoles such as 2-ethyl-4-methylimidazole and 1-cyanoethyl-2-ethyl-4-methylimidazole; phosphoric esters, triphenylphosphine and other phosphines; phosphonium compounds such as tetraphenylphosphonium tetra(p-tolyl)borate; organometallic salts such as tin octylate and zinc octylate; and metal chelates. Each of different curing accelerators may be used alone or in combination as the curing accelerator (E).

The curing accelerator (E) for use herein can also be any of commercial products available typically under the trade names of "U-CAT SA 506", "U-CAT SA 102", "U-CAT 5003", "U-CAT 18X", and "12XD (product under development)" (each from San-Apro Ltd.), the trade names of "TPP-K" and "TPP-MK" (each from Hokko Chemical Industry Co., Ltd.), and the trade name of "PX-4ET" (from Nippon Chemical Industrial Co., Ltd.).

The curable resin composition for light reflection according to the present invention may contain the curing accelerator (E) in an amount (blending amount) not critical, but preferably from 0.05 to 5 parts by weight, more preferably from 0.1 to 3 parts by weight, furthermore preferably from 0.2 to 3 parts by weight, and particularly preferably from 0.25 to 2.5 parts by weight, per 100 parts by weight of the total amount of epoxy-containing compounds (entire epoxy-containing compounds) contained in the curable resin composition for light reflection. The curable resin composition, if containing the curing accelerator (E) in an amount of less than 0.05 part by weight, may not enjoy sufficiently effective curing acceleration. In contrast, the curable resin composition, if containing the curing accelerator (E) in an amount of more than 5 parts by weight, may give a cured article that is colored and has an inferior hue.

Curing Catalyst (F)

The curing catalyst (F) in the curable resin composition for light reflection according to the present invention has the function of initiating the polymerization of an epoxy compound in the curable resin composition for light reflection. The curing catalyst (F) is preferably a cationic-polymerization initiator that generates a cationic species by the application of an ultraviolet ray or heat and initiates the polymerization of an epoxy compound (particularly, the alicyclic epoxy compound (A)).

Exemplary cationic-polymerization initiators that generate a cationic species by the application of an ultraviolet ray include hexafluoroantimonate salts, pentafluorohydroxyantimonate salts, hexafluorophosphate salts, and hexafluoroarsenate salts. Each of these cationic-polymerization initiators may be used alone or in combination. The cationic-polymerization initiators usable herein are preferably exemplified by commercial products available typically under the trade name of "UVACURE 1590" (from DAICEL-CYTEC Company, Ltd.), the trade names of "CD-1010", "CD-1011", and "CD-1012" (each from Sartomer Company Inc., U.S.A.), the trade name of "IRGACURE 264" (from Ciba Japan K.K.), and the trade name of "CIT-1682" (from Nippon Soda Co., Ltd.).

Exemplary cationic-polymerization initiators that generate a cationic species by the application of heat include aryldiazonium salts, aryliodonium salts, arylsulfonium salts, and arene-ion complexes. Each of these cationic-polymerization initiators may be used alone or in combination. The cationic-polymerization initiators are preferably exemplified by commercial products available typically under the trade names of "PP-33", "CP-66", and "CP-77" (each from ADEKA CORPORATION), the trade name of "FC-509" (from 3M Company), the trade name of "UVE1014" (from General Electric Company), the trade names of "San-Aid SI-60L", "San-Aid SI-80L", "San-Aid SI-100L", "San-Aid SI-110L", and "San-Aid SI-150L" (each from Sanshin Chemical Industry Co., Ltd.), and the trade name of "CG-24-61" (Ciba Japan K.K.). Exemplary cationic-polymerization initiator usable herein further include a compound of a silanol (e.g., triphenylsilanol) with a chelate compound between a metal (e.g., aluminum or titanium) and acetoacetic acid or a diketone; and a compound of a phenol (e.g., bisphenol-S) with a chelate compound between a metal (e.g., aluminum or titanium) and acetoacetic acid or a diketone.

The curable resin composition for light reflection according to the present invention may contain the curing catalyst (F) in an amount (blending amount) not critical, but preferably from 0.01 to 15 parts by weight, more preferably from 0.01 to 12 parts by weight, furthermore preferably from 0.05 to 10 parts by weight, and particularly preferably from 0.1 to 10 parts by weight, per 100 parts by weight of the total amount of epoxy-containing compounds (entire epoxy-containing compounds) contained in the curable resin composition for light reflection. The curable resin composition, when containing the curing catalyst (F) in an amount within the above-specified range, can give a cured article satisfactorily resistant to heat and light.

The curable resin composition for light reflection according to the present invention may further contain any of other components as follows, in addition to the alicyclic epoxy compound (A), the rubber particles (B), the white pigment (C), the curing agent (D), the curing accelerator (E), and the curing catalyst (F). Such other components are exemplified by bisphenol-A type, bisphenol-F type, and other glycidyl ether epoxy compounds having one or more aromatic rings; hydrogenated bisphenol-A type, aliphatic glycidyl type, and other glycidyl ether epoxy compounds having no aromatic ring; glycidyl ester epoxy compounds; glycidylamine epoxy compounds; polyol compounds; oxetane compounds; and vinyl ether compounds. Each of them may be used alone or in combination.

The curable resin composition may further contain even an epoxy compound that is solid at room temperature (25° C.), as long as becoming liquid after mixing. The epoxy compound that is solid at room temperature (25° C.) is exemplified by solid bisphenol epoxy compounds, novolak epoxy compounds, glycidyl esters, triglycidyl isocyanurate, and an adduct of 2,2-bis(hydroxymethyl)-1-butanol with 1,2-epoxy-4-(2-oxiranyl)cyclohexane (trade name "EHPE 3150" supplied by Daicel Chemical Industries Ltd.). Each of such epoxy compounds may be used alone or in combination.

Among them, the curable resin composition for light reflection according to the present invention preferably contains a glycidyl ether epoxy compound having no aromatic ring and/or a polyol compound that is liquid at 25° C. (excluding polyether polyols). This is preferred for better toughness (cracking resistance) without adversely affecting satisfactory heat resistance. The curable resin composition particularly preferably contains a glycidyl ether epoxy compound having no aromatic ring for better toughness (cracking resistance) without adversely affecting satisfactory resistance to heat and light.

Glycidyl Ether Epoxy Compound Having No Aromatic Ring Such glycidyl ether epoxy compounds having no aromatic ring includes aliphatic glycidyl ether epoxy compounds; and nuclear-hydrogenated compounds corresponding to aromatic glycidyl ether epoxy compounds. The glycidyl ether epoxy compound having no aromatic ring is preferably exemplified by commercial products available typically under the trade names of "EPICLON 703", "EPICLON 707", "EPICLON 720", and "EPICLON 725" (each from DIC Corporation), the trade names of "YH-300", "YH-315", "YH-324", "PG-202", "PG-207", and "SUNTOHTO ST-3000" (each from Tohto Kasei Co., Ltd.), the trade name of "Rikaresin DME-100" and "Rikaresin HBE-100" (each from New Japan Chemical Co., Ltd.), the trade names of "Denacol EX-212" and "Denacol EX-321" (each from Nagase ChemteX Corporation), and the trade names of "YX8000" and "YX8034" (each from Japan Epoxy Resins Co., Ltd.).

The curable resin composition may contain the glycidyl ether epoxy compound having no aromatic ring in an amount not critical, but preferably from 10 to 60 parts by weight and more preferably from 20 to 50 parts by weight, per 100 parts by weight of the alicyclic epoxy compound (A).

Polyol Compound That Is Liquid at 25° C. The polyol compound that is liquid at 25° C. includes polyol compounds excluding polyether polyols and is exemplified by polyester polyols and polycarbonate polyols.

The polyester polyols usable herein are exemplified by commercial products available typically under the trade names of "PLACCEL 205", "PLACCEL 205H", "PLACCEL 205U", "PLACCEL 205BA", "PLACCEL 208", "PLACCEL 210", "PLACCEL 210CP", "PLACCEL 210BA", "PLACCEL 212", "PLACCEL 212CP", "PLACCEL 220", "PLACCEL 220CPB", "PLACCEL 220NP1", "PLACCEL 220BA", "PLACCEL 220ED", "PLACCEL 220EB", "PLACCEL 220EC", "PLACCEL 230", "PLACCEL 230CP", "PLACCEL 240", "PLACCEL 240CP", "PLACCEL 210N", "PLACCEL 220N", "PLACCEL L205AL", "PLACCEL L208AL", "PLACCEL L212AL", "PLACCEL L220AL", "PLACCEL L230AL", "PLACCEL 305", "PLACCEL 308", "PLACCEL 312", "PLACCEL L312AL", "PLACCEL 320", "PLACCEL L320AL", "PLACCEL L330AL", "PLACCEL 410", "PLACCEL 410D", "PLACCEL 610", "PLACCEL P3403", and "PLACCEL CDE9P" (each from Daicel Chemical Industries Ltd.).

The polycarbonate polyols usable herein are exemplified by commercial products available typically under the trade names of "PLACCEL CD205PL", "PLACCEL CD205HL", "PLACCEL CD210PL", "PLACCEL CD210HL", "PLACCEL CD220PL", and "PLACCEL CD220HL" (each from Daicel Chemical Industries Ltd.), the trade names of "UH-CARB50", "UH-CARB100", "UH-CARB300", "UH-CARB90 (1/3)", "UH-CARB90 (1/1)", and "UC-CARB100" (each from Ube Industries, Ltd.), and the trade names of "PCDL T4671", "PCDL T4672", "PCDL T5650J", "PCDL T5651", and "PCDL T5652" (each from Asahi Kasei Chemicals Corporation).

The curable resin composition may contain the polyol compound that is liquid at 25° C. in an amount not critical, but preferably from 5 to 50 parts by weight and more preferably from 10 to 40 parts by weight, per 100 parts by weight of the total amount of the alicyclic epoxy compound (A) and the rubber particles (B).

In addition to the aforementioned components, the curable resin composition for light reflection according to the present invention can further include any of additives within ranges not adversely affecting advantageous effects of the present invention.

The curable resin composition may contain a hydroxyl-containing compound (e.g., ethylene glycol, diethylene glycol, propylene glycol, or glycerol) as the additive. This helps the reaction to proceed gently. The curable resin composition may further contain any of other customary additives within ranges not adversely affecting the advantageous effects of the present invention. Such customary additives are exemplified by silicone- or fluorine-containing antifoaming agents; leveling agents; silane coupling agents such as γ-glycidoxypropyltrimethoxysilane; surfactants; fillers; flame retardants; colorants; antioxidants; ultraviolet absorbers; ion adsorbents; pigments; and mold-release agents. The curable resin composition may contain these additives in an amount of preferably 5 percent by weight or less based on the total weight (100 percent by weight) of the curable resin composition for light reflection.

The curable resin composition for light reflection according to the present invention includes the alicyclic epoxy compound (A) and the white pigment (C) as essential components and thereby gives a cured article that has high light reflectivity and is satisfactorily resistant to heat and light. The cured article has superior toughness and is resistant to cracking. This effect is probably obtained for reasons as follows. The rubber particles (B) contained in the cured article relieve stress caused typically by heating. In addition, the curable resin composition for light reflection according to the present invention includes both the rubber particles (B) and the white pigment (C) and thereby has a suitable viscosity, and this helps the rubber particles (B) and the white pigment (C) to be satisfactorily dispersed stably over a long duration and to be more satisfactorily dispersed in the resulting cured article. Particularly when employing rubber particles having hydroxyl group and/or carboxyl group on their surface as the rubber particles (B), the curable resin composition allows the cured article to exhibit very excellent toughness. This is probably because the rubber particles (B) and the white pigment (C) interact with each other and can be dispersed more satisfactorily.

The curable resin composition for light reflection according to the present invention can be produced by any method not limited, as selected from among known or customary methods. Specifically, the curable resin composition may be produced by a method of formulating predetermined amounts of components and stirring/mixing them with any of mixers such as dissolvers and homogenizers, kneaders, rolls, bead mills, and planetary mixers. The components are the alicyclic epoxy compound (A), the rubber particles (B), the white pigment (C), the curing agent (D), the curing accelerator (E), and optional additives; or the alicyclic epoxy compound (A), the rubber particles (B), the white pigment (C), the curing catalyst (F), and optional additives. After stirring/mixing, the resulting mixture may be deaerated in a vacuum. A part or all of the rubber particles (B) may be dispersed in another component such as the alicyclic epoxy compound (A) before the mixing, as described above.

The curable resin composition for light reflection according to the present invention may be cured into a cured article by the application of heat and/or light such as an ultraviolet ray. The cured article obtained through curing from the curable resin composition for light reflection according to the present invention has high light reflectivity, is satisfactorily resistant to heat and light, and is tough. The cured article is therefore resistant to deterioration and less suffers from reduction in reflectance with time. The curable resin composition for light reflection according to the present invention is therefore advantageously usable in LED packaging (members or components for LED packaging, such as reflector materials and housing materials in optical semiconductor devices); bonding of electronic components; liquid crystal displays (e.g., reflector plates); inks for white substrates; and sealers. Above all, the curable resin composition is particularly advantageously usable as curable resin compositions for LED packaging (of which curable resin compositions for reflectors in optical semiconductor devices are more preferred).

The cured article (cured article derived from the curable resin compositions for light reflection according to the present invention) may have a reflectance not critical, but preferably 90% or more and more preferably from 90.5% or more with respect to light at a wavelength of 450 nm. The cured article has a reflectance of preferably 90% or more and more preferably from 90.5% or more with respect to light at wavelengths of from 450 to 800 nm. The reflectance can be measured typically by preparing a cured article (thickness: 3 mm) as a test piece from the curable resin composition for light reflection according to the present invention; and measuring a reflectance of the test piece with a spectrophotometer (trade name "Spectrophotometer UV-2450" supplied by Shimadzu Corporation).

The cured article (cured article derived from the curable resin composition for light reflection according to the present invention) may have a storage elastic modulus at 25° C. not critical, but preferably from 1.0 to 60 GPa and more preferably from 10 to 50 GPa. The cured article as the test piece, if having a storage elastic modulus at 25° C. of less than 1.0 GPa, may become susceptible to cracking upon forming or working of the test piece, although having flexibility. In contrast, the cured article, if having a storage elastic modulus at 25° C. of more than 60 GPa, may have insufficient toughness and become susceptible to cracking.

The cured article (cured article derived from the curable resin composition for light reflection according to the present invention) may have a storage elastic modulus at 260° C. not critical, but preferably from 0.10 to 2.0 GPa and more preferably from 0.20 to 1.8 GPa. The cured article as the test piece, if having a storage elastic modulus at 260° C. of less than 0.10 GPa, may be detached from a fixing jig or be broken during the measurement, although having flexibility. In contrast, the cured article as the test piece, if having a storage elastic modulus at 260° C. of more than 2.0 GPa, may have insufficient toughness and become susceptible to cracking.

The storage elastic modulus can be measured typically by preparing a cured article (5 mm wide by 40 mm long by 1 mm thick) as a test piece from the curable resin composition for light reflection according to the present invention; and measuring the storage elastic modulus of the test piece with a dynamic viscoelastic measurement instrument (dynamic mechanical spectrometer) (trade name "DMS 6100" supplied by Seiko Instruments Inc.).

Optical Semiconductor Device

An optical semiconductor device according to an embodiment of the present invention includes at least an optical semiconductor element as a light source; and a reflector (reflective member) including a cured article derived from the curable resin composition for light reflection according to the present invention. As used herein the term "reflector" refers to a member that is arranged in the optical semiconductor device, reflects light emitted from the optical semiconductor element to increase light directionality and light intensity, and helps the optical semiconductor device to have better light extraction efficiency. FIG. 1 are schematic diagrams illustrating an exemplary optical semiconductor device (optical semiconductor device according to an embodiment the present invention) having a reflector formed from a cured article derived from the curable resin composition for light reflection according to the present invention, in which FIG. 1(a) is a perspective view, and FIG. 1(b) is a cross-sectional view. In FIG. 1, the reference sign 1 stands for a reflector, 2 stands for a metal line, 3 stands for an optical semiconductor element (light-emitting diode), 4 stands for a bonding wire, 5 stands for an encapsulating resin, and 6 stands for a packaging resin. The reflector 1 has such a reversed-tapered shape as to surround the encapsulating resin 5 in a ring form with the ring diameter increasing upward. In the optical semiconductor device illustrated in FIG. 1, the light-emitting diode 3 emits light, and the reflector 1 reflects the emitted light on its surface (reflection plane) and contributes to efficient recovery of the light from the optical semiconductor element 3.

The reflector may be formed by any process as selected from among known or customary molding processes. The molding processes are exemplified by transfer molding, compression molding, injection molding, LIM (liquid injection molding; injection molding), and dam forming through dispensing.

Specifically, the reflector can be formed typically by injecting the curable resin composition for light reflection according to the present invention into a predetermined forming die; and heating and curing the composition. Conditions for the heating/curing in this process may be suitably regulated typically within ranges of a heating temperature of from 80° C. to 200° C. (preferably from 80° C. to 190° C., and more preferably from 80° C. to 180° C.) and a heating time of from 30 to 600 minutes (preferably from 45 to 540 minutes, and furthermore preferably from 60 to 480 minutes). For example, the heating/curing is preferably performed for a short heating time at a high preset heating temperature and is preferably performed for a long heating time at a low preset heating temperature. If one or both of the heating temperature and time are below the above-specified range, the curable resin composition may undergo insufficient curing. In contrast, if one or both of the heating temperature and time are above the above-specified ranges, resin components may decompose. The heating/curing process may be performed so that heating is performed in one step or multiple steps to proceed curing stepwise.

The heating process in the present invention is particularly preferably performed in multiple steps to proceed curing stepwise. This prevents foaming (blister) due to an abrupt curing reaction, relieves stress/strain caused by curing, and thereby helps the cured article to have better toughness (cracking resistance). Specifically, in an embodiment using the curing agent (D), curing is preferably performed by heating in a first step at a temperature of from 80° C. to 150° C. (more preferably from 100° C. to 140° C.) for a duration of from 30 to 300 minutes (more preferably from 45 to 270 minutes) and further heating in a second step at a temperature of from 100° C. to 200° C. (more preferably from 110° C. to 180° C.) for a duration of from 30 to 600 minutes (more preferably from 45 to 540 minutes). In another embodiment using the curing catalyst (F), curing is preferably performed by heating in a first step at a temperature of from 30° C. to 150° C. (more preferably from 40° C. to 140° C.) for a duration of from 30 to 300 minutes (more preferably from 45 to 270 minutes), and further heating in a second step at a temperature of from 60° C. to 200° C. (more preferably from 80° C. to 180° C.) for a duration of from 30 to 600 minutes.

The optical semiconductor device according to the present invention has at least a reflector including a cured article derived from the curable resin composition for light reflection according to the present invention and can stably emit light over a long duration even when the light to be outputted has a high intensity. In addition, the reflector including the cured article derived from the curable resin composition for light reflection according to the present invention has satisfactory adhesion to the encapsulating resin (particularly to an epoxy resin) for the optical semiconductor element and further less suffers from disadvantages such as reduction in luminous intensity with time. The optical semiconductor device according to the present invention can therefore act as a long-life optical semiconductor device with high reliability.

EXAMPLES

The present invention will be illustrated in further detail with reference to several examples below, which are by no means intended to limit the present invention.

The average particle diameter and maximum particle diameter of rubber particles were measured in the following manner. A sample as mentioned below was subjected to a measurement using the Nanotrac Particle Size Analyzer (trade name "UPA-EX150" supplied by Nikkiso Co., Ltd.) of the "Nanotrac™" system employing dynamic light scattering as a measurement principle, to plot a particle size distribution curve. In the particle size distribution curve, a cumulative average diameter, which is the particle diameter at which the cumulative curve reaches 50%, was defined as the average particle diameter, and a maximum (largest) particle diameter at which the frequency (%) of the measured particle size distribution exceeds 0.00% is defined as the maximum particle diameter.

Sample:
The sample was prepared by dispersing 1 part by weight of a rubber-particle-dispersed epoxy compound in 20 parts by weight of tetrahydrofuran, which rubber-particle-dispersed epoxy compound was obtained in Production Example 2 below.

The viscosity at 25° C. of the rubber-particle-dispersed epoxy compound obtained in Production Example 2 was measured with a digital viscometer (trade name "DVU-EII Type" supplied by Tokimec, Inc.). The rubber-particle-dispersed epoxy compound included 5 parts by weight of rubber particles dispersed in 100 parts by weight of CELLOXIDE 2021P (supplied by Daicel Chemical Industries Ltd.).

Production Example 1

Production of Rubber Particles

In a 1-liter polymerization reactor equipped with a reflux condenser were placed 500 g of ion-exchanged water and 1.3 g of sodium dioctylsuccinate. The mixture was heated to 80° C. with stirring in a nitrogen stream and combined with a monomer mixture added en block. The monomer mixture included 9.5 g of butyl acrylate, 2.57 g of styrene, and 0.39 g of divinylbenzene, the amounts of which corresponded to about 5 percent by weight of required amounts to form a core. The resulting mixture was emulsified by stirring for 20 minutes, combined with 12 mg of potassium peroxodisulfate, stirred for further one hour to perform a first seed polymerization, combined with 228 mg of potassium peroxodisulfate, and stirred for 5 minutes. The mixture was further combined with another monomer mixture continuously added over 2 hours to perform a second seed polymerization, aged for one hour, and yielded the core. The other monomer mixture contained 180.5 g of butyl acrylate, 48.89 g of styrene, and 7.33 g of divinylbenzene, whose amounts corresponded to the remainder (about 95 percent by weight) of the amounts required to form the core, and further contained 1.2 g of sodium dioctylsuccinate dissolved therein.

Next, 60 mg of potassium peroxodisulfate was added to the core, the resulting mixture was stirred for 5 minutes, and combined with a monomer mixture added continuously over 30 minutes to perform a seed polymerization, aged for one hour, and yielded a shell layer covering the core. The monomer mixture contained 60 g of methyl methacrylate, 2.0 g of acrylic acid, and 0.3 g of allyl methacrylate and further contained 0.3 g of sodium dioctylsuccinate dissolved therein.

Next, the resulting article was cooled down to room temperature (25° C.), filtrated through a plastic mesh with an opening of 120 μm, and yielded a latex including particles having a core-shell structure. The prepared latex was frozen at −30° C., dewatered and washed using a suction filter, dried through air blowing at 60° C. for a whole day and night, and yielded rubber particles. The prepared rubber particles had an average particle diameter of 108 nm and a maximum particle diameter of 289 nm.

Production Exampl 2

Production of Rubber-Particle-Dispersed Epoxy Compound

In a nitrogen stream at an elevated temperature of 60° C., 5 parts by weight of the rubber particles obtained in Production Example 1 was dispersed in 100 parts by weight of a product under the trade name of "CELLOXIDE 2021P" (supplied by Daicel Chemical Industries Ltd.) using a dissolver at 1000 rpm for 60 minutes, deaerated in a vacuum, and yielded a rubber-particle-dispersed epoxy compound. This had a viscosity of 1036 mPa·s at 25° C.

Examples 1 to 5 and Comparative Examples 1 to 3

Preparation of Curable Resin Composition
The rubber-particle-dispersed epoxy compound (in Examples 1 to 5), an epoxy compound (in Examples 2 to 5 and Comparative Examples 1 to 3), and a white pigment (titanium dioxide, supplied by Sakai Chemical Industry Co., Ltd. under the trade name of "TCR-52") were uniformly mixed in formulations given in Table 1 (in part by weight) using a dissolver, melted and kneaded with a roll mill under predetermined conditions (roll pitch: 0.2 mm, number of revolutions: 25 Hz, 3 passes), and yielded kneadates. The resulting kneadates were further uniformly mixed with a curing agent, a curing accelerator, and an additive in formulations given in Table 1 (in part by weight) with deaerating using a planetary mixer (trade name "AWATORIRENTARO (Thinky Mixer) AR-250" supplied by THINKY CORPORATION) at 2000 rpm for 5 minutes, and yielded curable resin compositions (curable epoxy resin compositions). The symbol "−" in Table 1 refers to that the component in question was not added.

Evaluation of Curable Resin Composition Cured Article

The curable resin compositions were each cast into a die, placed in an oven (trade name "GPHH-201" supplied by ESPEC Corporation), heated therein at 120° C. for 7 hours, and yielded cured articles. The reflectance and storage elastic moduli of the cured articles were measured by the following procedure, and whether the cured articles suffered from cracking upon shaping (cutting) and upon reflow process were evaluated. The evaluation results are indicated in Table 1.

Examples 6 and 7, Comparative Examples 4 and 5

Preparation of Curable Resin Composition

The rubber-particle-dispersed epoxy compound (in Examples 6 and 7), an epoxy compound (in Example 7 and Comparative Examples 4 and 5), a white pigment (titanium dioxide, trade name "TCR-52" supplied by Sakai Chemical Industry Co., Ltd.), and a curing catalyst were uniformly mixed in formulations given in Table 1 (in part by weight) using a dissolver, melted and kneaded with a roll mill under predetermined conditions (roll pitch: 0.2 mm, number of revolutions: 25 Hz, 3 passes), finally deaerated using a planetary mixer (trade name "AWATORIRENTARO (Thinky Mixer) AR-250" supplied by THINKY CORPORATION), and yielded curable resin compositions (curable epoxy resin compositions). The symbol "–" in Table 1 refers to that the component in question was not added.

Evaluation of Curable Resin Composition Cured Article

The curable resin compositions were each cast into a die, placed in an oven (trade name "GPHH-201" supplied by ESPEC Corporation), heated therein at 65° C. for 2 hours, raised in temperature to 150° C., heated at that temperature for one hour, and yielded cured articles. The reflectance and storage elastic moduli of the cured articles were measured by the following procedure, and whether the cured articles suffered from cracking upon shaping (cutting) and upon reflow process were evaluated. The evaluation results are indicated in Table 1.

Reflectance Evaluation

Test pieces 3 mm thick were prepared by cutting the cured articles obtained in the examples and comparative examples. A reflectance of each test piece was measured with respect to light at a wavelength of 450 nm using a spectrophotometer (trade name "Spectrophotometer UV-2450" supplied by Shimadzu Corporation) and was defined as an "initial reflectance".

Heat Resistance Test

Each of the test pieces (3 mm thick) after the initial reflectance measurement was heated at 120° C. for 250 hours. A reflectance of the resulting test piece was measured with respect to light at a wavelength of 450 nm and was defined as a "reflectance after thermal aging". A reflectance retention (after thermal aging; with respect to before thermal aging) was calculated according to an equation as follows:

[Reflectance retention(after thermal aging;with respect to before thermal aging)]=([Reflectance after thermal aging]/[Initial reflectance])×100

Light Resistance Test

Each of the test pieces (3 mm thick) after the initial reflectance measurement was irradiated with an ultraviolet ray at an intensity of 10 mW/cm$^2$ for 250 hours. A reflectance of the resulting test piece was measured with respect to light at a wavelength of 450 nm and was defined as a "reflectance after ultraviolet aging". A reflectance retention (after ultraviolet aging; with respect to before ultraviolet aging) was calculated according to an equation as follows:

[Reflectance retention(after ultraviolet aging;with respect to before ultraviolet aging)]=([Reflectance after ultraviolet aging]/[Initial reflectance])×100

Storage Elastic Modulus Evaluation

Test pieces 5 mm wide by 40 mm long by 1 mm thick were prepared by cutting the cured articles obtained in the examples and comparative examples. Next, a storage elastic modulus at 25° C. and a storage elastic modulus at 260° C. of each test piece were measured using a dynamic viscoelastic measurement instrument (dynamic mechanical spectrometer) (trade name "DMS 6100" supplied by Seiko Instruments Inc.).

Cracking Resistance Evaluation (Toughness Evaluation) upon Cutting

Test pieces 5 mm wide by 5 mm long by 3 mm thick were prepared by cutting the cured articles obtained in the examples and comparative examples. The cured articles were cut with a micro cutting machine (trade name "BS-300CL" supplied by MEIWAFOSIS CO., LTD). Whether each cured article suffered from cracking or not was observed and examined with a digital microscope (trade name "VHX-900" supplied by Keyence Corporation). Ten test pieces per one sample were prepared by cutting, and a number of test pieces, out of ten, appearing to be cracked was indicated in number per ten test pieces as an evaluation result in Table 1.

Cracking Resistance Evaluation (Toughness Evaluation) upon Reflow Process

The test pieces 5 mm wide by 5 mm long by 3 mm thick prepared by cutting were each subjected to a reflow process for a total reflow time of 90 seconds, where each test piece was held at a highest temperature of 260° C. for 5 seconds, using a reflow oven (trade name "UNI-5016F" supplied by NIPPON ANTOM CO., LTD). Whether each test piece suffered from cracking as a result of the reflow process or not was observed and examined with a digital microscope (trade name "VHX-900" supplied by Keyence Corporation). Ten test pieces per one sample were subjected to the reflow process, and a number of test pieces, out of ten, appearing to be cracked was indicated in number per ten test pieces as an evaluation result in Table 1.

White Pigment Dispersion Stability Evaluation

The dispersion stability of the white pigments in the curable resin compositions (curable epoxy resin compositions) obtained in the examples and comparative examples was evaluated in the following manner. Dispersions were prepared by dispersing the white pigment and the rubber particles in the epoxy compound (epoxy resin) for the examples, or by dispersing the white pigment in the epoxy compound for the comparative examples. The dispersions were each left stand at room temperature for 30 days, and whether the white pigment in the resulting dispersion sedimented or not was examined as an index of the dispersion stability. Specifically, the dispersion stability was evaluated in the following manner.

Components (the rubber-particle-dispersed epoxy compound or epoxy compound, and the white pigment) other than the curing agent, additive, curing accelerator, and curing catalyst were uniformly mixed in formulations given in Table 1 (in part by weight) using a dissolver to give a mixture, the mixture was melted and kneaded with a roll mill under predetermined conditions (roll pitch: 0.2 mm, number of revolutions: 25 Hz, 3 passes), finally deaerated using a planetary mixer (trade name "AWATORIRENTARO (Thinky Mixer) AR-250" supplied by THINKY CORPORATION), and yielded the dispersions. Each of the dispersions was placed in a transparent glass vessel, left stand at room temperature, and the dispersion stability of the white pigment after 30 days was visually evaluated. Specifically, a sample dispersion suffering from sedimentation of the white pigment was evaluated as having poor dispersion stability (presence of sedimentation (pres.)); whereas a sample not suffering from sedimentation of the white pigment was evaluated as having good dispersion stability (absence of sedimentation (abs.)). The results are indicated in Table 1.

Abbreviations in Table 1 refer to as follows:

CEL2021P: Product under the trade name of "CELLOXIDE 2021P" (3,4-epoxycyclohexylmethyl(3,4-epoxy)cyclohexanecarboxylate), supplied by Daicel Chemical Industries Ltd.

EHPE3150: Product under the trade name of "EHPE3150" (adduct of 2,2-bis(hydroxymethyl)-1-butanol with 1,2-epoxy-4-(2-oxiranyl)cyclohexane), supplied by Daicel Chemical Industries Ltd.

TABLE 1

| | | | Ex. 1 | Ex. 2 | Ex. 3 | Ex. 4 | Ex. 5 | Ex. 6 |
|---|---|---|---|---|---|---|---|---|
| Curable resin composition | Rubber-particle-dispersed epoxy compound [part by weight] | | 100 | 85 | 70 | 85 | 70 | 100 |
| | Epoxy compound [part by weight] | CEL2021P | — | 15 | 30 | — | — | — |
| | | EHPE3150 | — | — | — | 15 | 30 | — |
| | Curing agent [part by weight] | MH-700 | 110 | 120 | 120 | 120 | 120 | — |
| | Additive [part by weight] | Ethylene glycol | 1.5 | 1.5 | 1.5 | 1.5 | 1.5 | — |
| | Curing accelerator [part by weight] | U-CAT SA506 | 0.5 | 0.5 | 0.5 | 0.5 | 0.5 | — |
| | White pigment [part by weight] | Titanium dioxide | 150 | 150 | 150 | 150 | 150 | 150 |
| | Curing catalyst [part by weight] | San-Aid SI-100L | — | — | — | — | — | 0.7 |
| | Functional group on rubber particles | | carboxyl group | carboxyl group | carboxyl group | carboxyl group | carboxyl group | carboxyl group |
| | Average particle diameter (nm) of rubber particles | | 108 | 108 | 108 | 108 | 108 | 108 |
| | Maximum particle diameter (nm) of rubber particles | | 289 | 289 | 289 | 289 | 289 | 289 |
| White pigment dispersion stability evaluation result | Presence or absence of white pigment sedimentation | | abs. | abs. | abs. | abs. | abs. | abs. |
| Cured article evaluation results | Initial reflectance [%] | | 91.2 | 91.1 | 91.1 | 90.5 | 90.3 | 90.7 |
| | Reflectance retention [%] | After thermal aging | 79 | 78 | 78 | 74 | 73 | 75 |
| | | After ultraviolet aging | 100 | 99 | 99 | 100 | 99 | 99 |
| | Storage elastic modulus [GPa] | 25° C. | 22.32 | 23.16 | 23.40 | 23.82 | 23.94 | 22.86 |
| | | 260° C. | 0.72 | 0.78 | 0.90 | 1.08 | 120 | 0.90 |
| | Cracking upon cutting | | 0/10 | 0/10 | 0/10 | 0/10 | 0/10 | 0/10 |
| | Cracking upon reflow process | | 0/10 | 0/10 | 0/10 | 0/10 | 0/10 | 0/10 |

| | | | Ex. 7 | Com. Ex. 1 | Com. Ex. 2 | Com. Ex. 3 | Com. Ex. 4 | Com. Ex. 5 |
|---|---|---|---|---|---|---|---|---|
| Curable resin composition | Rubber-particle-dispersed epoxy compound [part by weight] | | 70 | — | — | — | — | — |
| | Epoxy compound [part by weight] | CEL2021P | 15 | 100 | — | 50 | 100 | 85 |
| | | EHPE3150 | 15 | — | 100 | 50 | — | 15 |
| | Curing agent [part by weight] | MH-700 | — | 120 | 120 | 120 | — | — |
| | Additive [part by weight] | Ethylene glycol | — | 1.5 | 1.5 | 1.5 | — | — |
| | Curing accelerator [part by weight] | U-CAT SA506 | — | 0.5 | 0.5 | 0.5 | — | — |
| | White pigment [part by weight] | Titanium dioxide | 150 | 150 | 150 | 150 | 150 | 150 |
| | Curing catalyst [part by weight] | San-Aid SI-100L | 0.7 | — | — | — | 0.7 | 0.7 |
| | Functional group on rubber particles | | carboxyl group | — | — | — | — | — |
| | Average particle diameter (nm) of rubber particles | | 108 | — | — | — | — | — |
| | Maximum particle diameter (nm) of rubber particles | | 289 | — | — | — | — | — |
| White pigment dispersion stability evaluation result | Presence or absence of white pigment sedimentation | | abs. | pres. | pres. | pres. | pres. | pres. |
| Cured article evaluation results | Initial reflectance [%] | | 90.0 | 91.0 | 89.8 | 90.3 | 90.6 | 89.9 |
| | Reflectance retention [%] | After thermal aging | 71 | 78 | 72 | 73 | 75 | 70 |
| | | After ultraviolet aging | 99 | 100 | 98 | 99 | 99 | 99 |
| | Storage elastic modulus [GPa] | 25° C. | 23.16 | 27.3 | 28.38 | 28.08 | 28.80 | 28.92 |
| | | 260° C. | 0.96 | 1.14 | 1.08 | 1.20 | 1.14 | 1.14 |
| | Cracking upon cutting | | 0/10 | 9/10 | 10/10 | 10/10 | 10/10 | 10/10 |
| | Cracking upon reflow process | | 0/10 | Not evaluated [*1] | | | | |

[*1] The cured article was cracked during cutting, and cracking resistance evaluation upon reflow process was not performed.

MH-700: Product under the trade name of "RIKACID MH-700" (70:30 mixture of 4-methylhexahydrophthalic anhydride and hexahydrophthalic anhydride), supplied by New Japan Chemical Co., Ltd.

U-CAT SA506: Product under the trade name of "U-CAT SA506" (1,8-diazabicyclo(5.4.0)undecene/7-p-toluenesulfonic acid salt), supplied by San-Apro Ltd.

San-Aid SI-100L: Product under the trade name of "San-Aid SI-100L" (arylsulfonium salt), supplied by Sanshin Chemical Industry Co., Ltd.

Ethylene glycol: Product supplied by Wako Pure Chemical Industries, Ltd.

White pigment: Product under the trade name of "TCR-52" (titanium dioxide), supplied by Sakai Chemical Industry Co., Ltd.

As is demonstrated by Table 1, the cured articles derived from the curable resin compositions for light reflection according to the present invention had superior light reflectivity and were tough without suffering from cracking upon cutting and reflow process. In addition, the cured articles maintained high light reflectivity even after thermal aging and ultraviolet aging and were satisfactorily resistant to heat and light. The curable resin compositions for light reflection according to the present invention had superior white pigment dispersion stability.

By contrast, the cured articles using no rubber particles (the comparative examples) suffered from cracking upon cutting and had inferior toughness. The curable resin compositions according to the comparative examples had inferior white pigment dispersion stability.

INDUSTRIAL APPLICABILITY

The curable resin compositions for light reflection according to embodiments of the present invention are advantageously usable in various uses including electric/electronic encapsulants (molding compounds) relating to optical semiconductors. Particularly when used as curable resin compositions for LED packaging, the curable resin compositions give optical semiconductor devices that can continuously exhibit excellent performance over a long duration and serve as long-life optical semiconductor devices with high reliability.

REFERENCE SIGNS LIST

1: reflector (reflector including a cured article derived from the curable resin composition for light reflection according to the present invention)
2: metal line
3: optical semiconductor element
4: bonding wire
5: encapsulating resin
6: packaging resin

The invention claimed is:

1. A curable resin composition for light reflection, comprising: an alicyclic epoxy compound (A); rubber particles (B); a white pigment (C); a curing agent (D); and a curing accelerator (E),
wherein the white pigment (C) is included in an amount from 80 to 500 parts by weight per 100 parts by weight of the total amount of epoxy-containing compounds contained in the curable resin composition for light reflection; and
wherein the alicyclic epoxy compound (A) is an alicyclic epoxy compound represented by the following Formula (1):

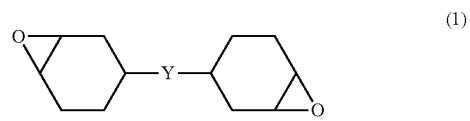

wherein Y represents a single bond or a linkage group, the linkage group being selected from the group consisting of divalent hydrocarbon groups, a carbonyl group, an ether bond, an ester bond, an amide bond, a carbonate bond, and groups each including two or more of them as linked.

2. A curable resin composition for light reflection, comprising: an alicyclic epoxy compound (A); rubber particles (B); a white pigment (C); and a curing catalyst (F),
wherein the white pigment (C) is included in an amount from 80 to 500 parts by weight per 100 parts by weight of the total amount of epoxy-containing compounds contained in the curable resin composition for light reflection; and
wherein the alicyclic epoxy compound (A) is an alicyclic epoxy compound represented by the following Formula (1):

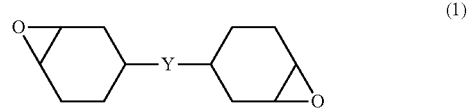

wherein Y represents a single bond or a linkage group, the linkage group being selected from the group consisting of divalent hydrocarbon groups, a carbonyl group, an ether bond, an ester bond, an amide bond, a carbonate bond, and groups each including two or more of them as linked.

3. The curable resin composition for light reflection according to claim 1, wherein the rubber particles (B) comprise a polymer comprising a (meth)acrylic ester as a monomer component; the rubber particles (B) have hydroxyl group and/or carboxyl group on a surface thereof; and the rubber particles (B) have an average particle diameter of from 10 to 500 nm and a maximum particle diameter of from 50 to 1000 nm.

4. The curable resin composition for light reflection according to claim 1, wherein the white pigment (C) comprises at least one selected from the group consisting of aluminum oxide, magnesium oxide, antimony oxides, titanium dioxides, zirconium oxide, and inorganic hollow particles.

5. The curable resin composition for light reflection according to claim 1, wherein the white pigment (C) has a median particle diameter of from 0.1 to 50 μm.

6. The curable resin composition for light reflection according to claim 1, as a curable resin composition for LED packaging.

7. An optical semiconductor device at least comprising: an optical semiconductor element; and a reflector, the reflector comprising a cured article derived from the curable resin composition for light reflection of claim 6.

8. The curable resin composition for light reflection according to claim 2, wherein the rubber particles (B) comprise a polymer comprising a (meth)acrylic ester as a monomer component; the rubber particles (B) have hydroxyl group and/or carboxyl group on a surface thereof; and the rubber particles (B) have an average particle diameter of from 10 to 500 nm and a maximum particle diameter of from 50 to 1000 nm.

9. The curable resin composition for light reflection according to claim 2, wherein the white pigment (C) comprises at least one selected from the group consisting of aluminum oxide, magnesium oxide, antimony oxides, titanium dioxides, zirconium oxide, and inorganic hollow particles.

10. The curable resin composition for light reflection according to claim 3, wherein the white pigment (C) comprises at least one selected from the group consisting of aluminum oxide, magnesium oxide, antimony oxides, titanium dioxides, zirconium oxide, and inorganic hollow particles.

11. The curable resin composition for light reflection according to claim 2, wherein the white pigment (C) has a median particle diameter of from 0.1 to 50 µm.

12. The curable resin composition for light reflection according to claim 3, wherein the white pigment (C) has a median particle diameter of from 0.1 to 50 µm.

13. The curable resin composition for light reflection according to claim 4, wherein the white pigment (C) has a median particle diameter of from 0.1 to 50 µm.

14. The curable resin composition for light reflection according to claim 2, as a curable resin composition for LED packaging.

15. The curable resin composition for light reflection according to claim 3, as a curable resin composition for LED packaging.

16. The curable resin composition for light reflection according to claim 4, as a curable resin composition for LED packaging.

17. The curable resin composition for light reflection according to claim 5, as a curable resin composition for LED packaging.

* * * * *